United States Patent [19]

Lohstroh

[11] 4,388,636

[45] Jun. 14, 1983

[54] STATIC MEMORY CELL AND MEMORY CONSTRUCTED FROM SUCH CELLS

[75] Inventor: Jan Lohstroh, Eindhoven, Netherlands

[73] Assignee: U.S. Philips Corporation, New York, N.Y.

[21] Appl. No.: 182,260

[22] Filed: Aug. 28, 1980

[30] Foreign Application Priority Data

Sep. 11, 1979 [NL] Netherlands .................... 7906752

[51] Int. Cl.³ .............. H01L 27/12; H01L 29/72; H01L 27/02
[52] U.S. Cl. ............................. 357/49; 357/34; 357/46; 357/51
[58] Field of Search ................ 351/51, 50, 49, 46, 351/34

[56] References Cited

U.S. PATENT DOCUMENTS 4,032,902 6/1977 Herndon ................ 357/51 X
4,257,059 3/1981 Herndon ................ 357/46 X

FOREIGN PATENT DOCUMENTS 7906752 11/1979 Netherlands .

Primary Examiner—Martin H. Edlow
Assistant Examiner—J. Carroll
Attorney, Agent, or Firm—Thomas A. Briody; Robert T. Mayer; Steven R. Biren

[57] ABSTRACT

A static cross-coupled bipolar memory cell has a large read current/stand-by current ratio and short write time. The nonlinear load element includes a resistor with a parallel-connected pnp transistor serving as a diode and an inversely-operating npn transistor for dissipating charge carriers.

4 Claims, 6 Drawing Figures

STATIC MEMORY CELL AND MEMORY CONSTRUCTED FROM SUCH CELLS

BACKGROUND OF THE INVENTION

The invention relates to a static bipolar memory cell having a first and a second transistor, in which the base zone of the first transistor is connected to the collector zone of the second transistor and the base zone of the second transistor is connected to the collector zone of the first transistor, and in which the collector zones are connected to a supply line via a load element.

Such memory cells and memories having such cells are generally known.

In a simple form, the load elements in known cells are formed by resistors which exhibit a current-voltage characteristic which, in principle, is linear.

However, these cells have the disadvantage of a small read/stand-by current ratio (substantially=1). Preferably, however, this ratio is as large as possible, as will be explained hereinafter.

As is known, the cells have two stable states in which a current flows either through the first or through the second transistor depending on the stored information. During operation, the situation will regularly occur that the information stored in a cell need not be read. The current which flows through the cell in this situation, and which is termed stand-by current, mainly determines the stand-by power dissipation, and for this reason is kept as small as possible. The lower limit of the stand-by current is determined by the impedance of the load elements. Below said lower limit stability criteria are no longer satisfied so that the stored information may be lost. During reading, a large current is preferably passed through the cell so as to rapidly charge parasitic capacitances and hence reduce the read time. The maximum value for the read current is also determined by the value of the impedance of the load element.

In order to improve the ratio of read current/stand-by current, it has previously been suggested to use a nonlinear resistive element instead of a linear resistive element. Such a nonlinear resistive element may be formed, for example, by a resistor with a diode connected in parallel, so that a small stand-by current can be passed via the comparatively high resistance and the large read current via the diode. These diodes provide nonlinear loads with which in practice read/stand-by current ratios of 10-20 have been obtained. In a process known per se with an epitaxial layer of one conductivity type on a substrate of the same conductivity type and intermediate buried collector layers of the opposite conductivity type, the diodes can even be obtained automatically, as will become apparent from the description of the Figures hereinafter. The devices obtained in this simple manner show favorable properties in the sense that, as a result of the low stand-by current, dissipation is low, while read time may be small due to the large read current.

SUMMARY OF THE INVENTION

It is often desirable, however, to shorten the write time during which the information is recorded in the cell. It is an object of the invention to provide a static bipolar memory cell in which a considerable reduction of the write time is obtained while maintaining a favorable read current/stand-by current ratio.

A static memory cell of the type mentioned above includes a semiconductor body of one conductivity type having a surface-adjoining surface layer of one conductivity type with two juxtaposed mutually-insulated islands which are separated from the remainder of the semiconductor body on the lower side by first and second buried layers of the second conductivity type having a lower resistivity than that of said surface layer; a first and a second transistor in a first and the other of the said islands, respectively, which transistors each comprise a base zone of one conductivity type, at least one surface-adjoining emitter zone of the second conductivity type, and a collector zone of the second conductivity type which is formed at least partly by the associated buried layer of the second conductivity type; cross links between the base zone of the first transistor and the collector zone of the second transistor and between the base zone of the second transistor and the collector zone of the first transistor; a first and a second load element between a supply line and the collector zones of the first and the second transistor, respectively, which load elements each comprise a resistor and a diode connected in parallel when the current passes in the forward direction, the resistors of the first and the second load element being formed by a resistance region of one conductivity type extending between the base zone of the second transistor and a supply connection in the second island and by a resistance region of one conductivity type extending between the base zone of the first transistor and a supply connection to the first island, respectively, the diodes of the first and the second load element being formed by the p-n junctions between the buried layer below the first island and the resistance region in the first island and between the buried layer below the second island and the resistance region in the second island, respectively; a third and a fourth transistor in the first and the second island, respectively, at the area of the said supply connections, which transistors comprise a base zone of one conductivity type and an emitter zone and a collector zone of the second conductivity type, the emitter-base junctions of said transistors being formed by the said p-n junctions between the buried layers of the second conductivity type and the resistance regions of the one conductivity type, the collector zones of said transistors being formed by surface zones of the second conductivity type which are provided in the resistance regions and which form p-n junctions with the resistance regions, said junctions being short-circuited by the supply connections.

It has been found that with memory cells in accordance with the invention a read current/stand-by current ratio of 10-20 can be obtained, while in 1k memories, constructed from said cells, write times of well below 10 ns were obtained. As will become apparent from the description of the figures, the manufacture of these cells does not require any additional or complicated process steps, while the overall area which the cell occupies in the semiconductor body is about the same as, or only slightly larger than that of known memory cells, which is of considerable importance for the construction of larger memories.

BRIEF DESCRIPTION OF THE DRAWING

The invention will now be described in greater detail, by way of example, with reference to several embodiments and the accompanying diagrammatic drawing, in which.

It is to be noted that the figures are not drawn to scale and that in the plan view primarily only the mutual position of the islands, contact holes and metallizations are shown for reasons of clarity.

DETAILED DESCRIPTION

Figure 1:
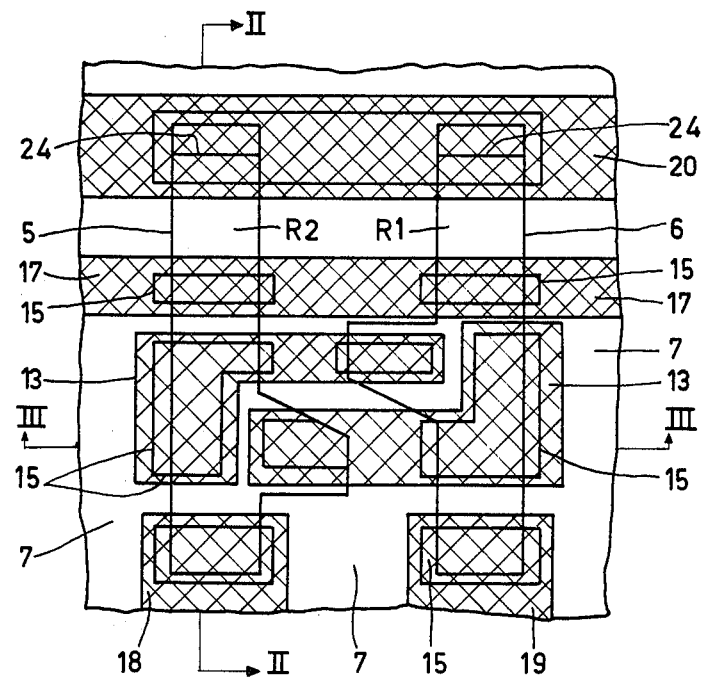
FIG. 1 is a diagrammatic plan view of a static memory cell according to the invention.
Figure 2:
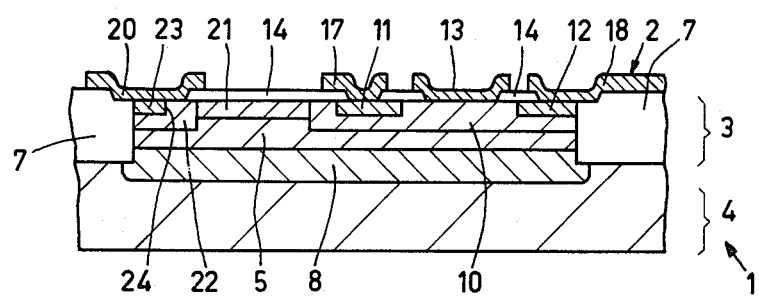
FIG. 2 is a sectional view taken on the line II—II of FIG. 1.
Figure 3:
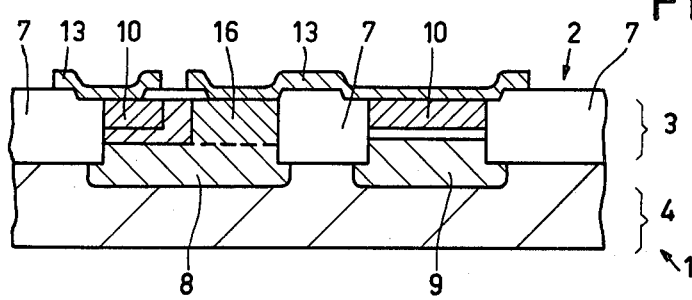
FIG. 3 is a sectional view taken on the line III—III of FIG. 1.

The device shown in FIGS. 1–3 comprises a semiconductor body 1 of silicon of substantially one conductivity type. By way of example, a body of the p-type is chosen but, of course, an n-type body may also be used as a starting material.

The semiconductor body 1 comprises a surface layer 3 of the p-type adjoining the surface 2. The layer may be formed, for example, by a lightly doped p-type epitaxial layer 3 grown on a p-type substrate 4.

Island-like, mutually electrically isolated regions 5, 6, hereinafter termed first and second islands, respectively, are formed in the epitaxial layer 3. On their vertical sides the islands 5, 6 are bounded by dielectric 7 consisting of a pattern of silicon oxide which extends from the surface 2 in the direction of the thickness of the semiconductor body 1 down to n-type regions 8, 9. The regions 8, 9 are formed by buried layers extending below the whole islands 5 and 6, respectively, and separating said islands from the remainder of the semiconductor body 1. The buried layers 8, 9 can be obtained in known manner by locally providing, prior to providing the epitaxial layer 3, the p-type substrate 4 with As-doped regions from which the buried layers are then formed by diffusion of the As to obtain a lower resistivity than that of the surface layer 3.

A first transistor $T_1$ is formed in the island 5 having a p-type base zone 10, an n-type emitter zone 11 and an n-type collector zone which is formed at least partly by the buried layer 8 below the island 5. In addition to the emitter zone 11 the transistor comprises a second emitter zone 12 which serves for output selection but, of course, other known output selection methods may also be used.

A second transistor, hereinafter referred to as $T_2$, is formed in a similar manner in the island 6 likewise having a p-type base zone 10, two emitter zones 11, 12, and a collector zone formed by the buried layer 9 below the island 6.

Between the base 10 of $T_1$ and the collector 9 of $T_2$ a cross-link 13 is present in the form of a metal layer of, for example, Al, which is contacted to the zones 9 and 10 via contact windows 15 in the oxide layer 14 covering the surface. To improve the contacts between the Al layer 13 and the buried layer 8, 9 deep n-zones 16 may be provided (see FIG. 3) which extend at the area of the contacts between the surface 2 and the buried layers 8, 9.

It is to be noted that the contact holes 15, as shown in FIG. 1, may exceed the edges of the islands since said edges are bounded by the comparatively thick silicon oxide pattern 7, of which a thin layer may be removed without any objections during opening the windows 15.

Similarly, a cross-link 13 is also present between the base 10 of $T_2$ and the collector 8 of $T_1$. Via overlapping windows 15 the emitters 11 of $T_1$ and $T_2$ are connected to a metal line 17 and the emitters 12 are connected to the selection lines 18, 19.

The collector zones 8, 9 of $T_1$ and $T_2$, respectively, are connected to a supply line 20 via load elements each comprising a resistor and a parallel connected diode. For example, collector 8 of $T_1$ is coupled via cross-link 13 (see FIG. 4) to the resistor $R_1$ and simultaneously to the emitter-base junction $D_1$ of the pnp transistor $T_{r1}$ serving as a diode. The collector 9 of $T_2$ is connected in an identical manner to $R_2$ and the diode $D_2$ is connected in parallel with $R_1$ and consists of the emitter-base junction of $T_2$. In the embodiment shown in FIGS. 1 to 3, $R_2$ is formed by the p-type region of island 5 between the base zone 10 of $T_1$ and the line 20, which region is provided at the surface 2 with a p-type zone 21, doped by means of implantation so as to obtain the desired resistance. $R_1$ is formed by the p-type region of island 6 between the base zone 10 of $T_2$ and the line 20, which region is also provided with an implanted zone like zone 21 to obtain the desired resistance. At the area of the connections between $R_1$ and $R_2$ in the supply line 20, contact zones 22 may be provided so as to obtain a good contact. The zones 22 may be formed simultaneously with the base zones 10. The pnp transistors $T_{r1}$ and $T_{r2}$ are obtained automatically with the zones 22, as p-type emitter, the buried layers 8, 9 as n-type base zones and the p-type substrate 4 as collector. The current gain $\beta$ of these transistors ($\beta = ic/ib$) is so low that during reading of the cells, substantially the whole current through the collector zones flows as a diode current across the emitter-base junction of $T_{r1}$ or $T_{r2}$, so that substantially no current is lost via the substrate.

Figure 4:
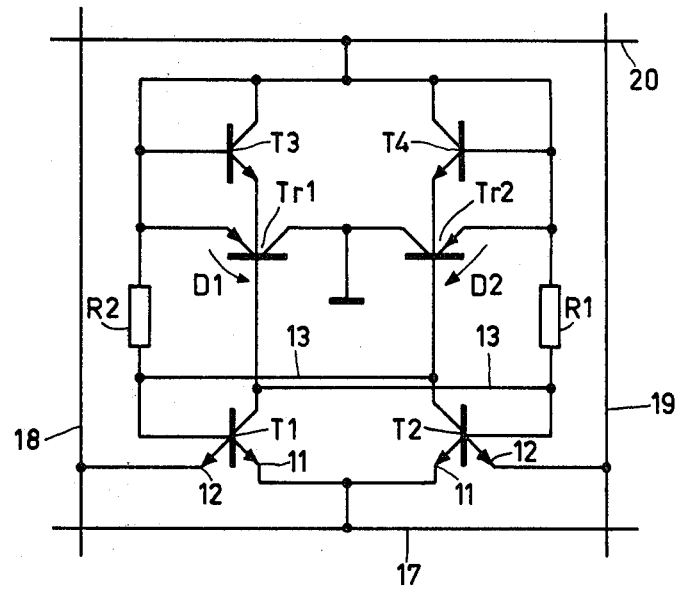
FIG. 4 shows the electric equivalent circuit diagram.

In order to improve speed, as shown in the circuit diagram of FIG. 4, a third and a fourth npn transistor $T_3$ and $T_4$, respectively, are incorporated between the supply line 20 and the collectors 8, 9 of $T_1$ and $T_2$ with short-circuited base-collector junction serving as a diode in parallel with the diodes $D_1$ and $D_2$, respectively. As shown *inter alia* in FIG. 2, the transistors $T_3$ and $T_4$ can simply be obtained by providing an n-type zone 23 in the p-type zones 22, preferably simultaneously with the provision of the emitter zones 11, 12 below a part of the contacts between the zones 22 and the supply line 20, so that the p-n junctions 24 between the p-type zones 22 and the n-type zones 23 are short-circuited by the line 20. The transistors $T_3$ and $T_4$ are now formed by the inversely-operating npn structures, the buried layers 8, 9 of which form the emitters, the zones 22,5 or 22,6 form the base zones and the n-type zones 23 form the collectors.

Because comparatively large values can be chosen for $R_1$ and $R_2$,—since in fact the large read currents are conveyed via the diodes $D_1$, $T_3$ or $D_2$, $T_4$,—very low standby currents may be chosen (for low dissipation) while the required stability criteria are met. Large read currents are possible due to the presence of the parallel operating diodes $D_1$, $T_3$ and $D_2$, $T_4$. In addition, the cell described has very short write times despite the possible large charge storage in the diodes $D_1$ and $D_2$. As long as the saturation current of the npn transistors $T_3$, $T_4$ is larger than the saturation current of the diodes $D_1$, $D_2$, and so long as the cut-off frequency of the npn transistor $T_3$, $T_4$ is larger than that of the diodes $D_1$, $D_2$ (pnp transistors) the write time of the memory cell will substantially not be influenced detrimentally by the long switching off times of $D_1$, $D_2$.

By means of the memory cells described, 1k-bit memories have been realized with stand-by current/read current ratios of 10-20 and with write times of well below 10 n.s. (in the order of 5 n.s.). Such a memory can be manufactured by means of conventional process steps and with a very large density, since the extra diodes and transistors present with respect to the usual cells need not be provided separately but are obtained automatically in the manner described.

In the embodiment described, a p-type epitaxial layer having a large resistance is used. However, the invention may also be used when the p-type epitaxial layer is replaced by an n-type epitaxial layer.

Figure 5:
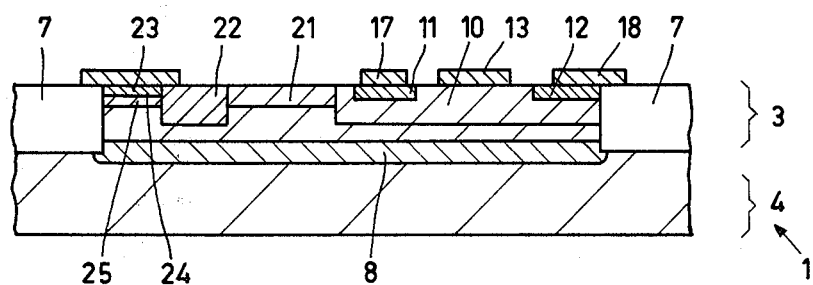
FIG. 5 is a sectional view of a modified embodiment of a memory cell according to the invention.

FIG. 5 shows a modified embodiment of the cell described in the first embodiment, in a sectional view corresponding to the sectional view of FIG. 2 in which the oxide layer 14 on the surface 2 with the windows provided therein are omitted for clarity. The cell differs from the preceding one in that the n-type zone 23 is not provided in the contact zone 22 but beside it, in an extended portion 25 of the implanted zone 21 having a higher resistance than the zone 22. By means of this cell a further improvement in the switching time of the npn transistors can be obtained due to the more favorable doping profile in the base of the npn transistor $T_3$, $T_4$. Moreover, diodes 24 having a higher saturation current can be obtained in this manner.

In this embodiment the p-type epitaxial layer 3 may be replaced by an n-type epitaxial layer.

Figure 6:
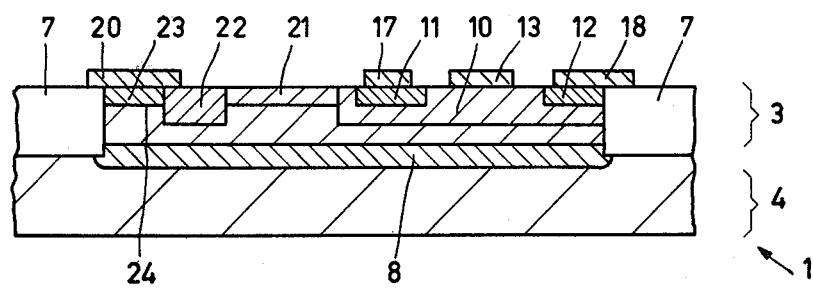
FIG. 6 is a sectional view of a further modified embodiment of a memory cell according to the invention.

FIG. 6 shows a further modified embodiment in which the previous advantages (shorter transit time and higher saturation current) can also be obtained. In this embodiment the extra n-zone 23 beside the p-type contact zone 22 is provided directly in the weakly doped p-type layer 3.

It will be obvious that the invention is not restricted to the embodiments described, but that many variations are possible to those skilled in the art without departing from the scope of this invention.

For example, in the embodiments described all the conductivity types may be reversed. Instead of the sunken oxide pattern 7, other insulation means, for example etched grooves, may also be used. In the embodiments, only one metallization layer is shown for clarity. In practical constructions, however, in which crossovers between the conductor tracks occur, multi-layer wirings may be used.

What is claimed is:

1. A static bipolar memory cell comprising:
   A. a semiconductor body of a first conductivity type having a surface-adjoining surface layer of one conductivity type comprising first and second juxtaposed mutually-insulated islands which are separated from the remainder of the semiconductor body on their lower sides by first and second buried layers of a second conductivity type opposite to that of the first, said buried layers having a lower resistivity than that of said surface layer;
   B. first and second transistors in said first and second islands, respectively, which transistors each comprise a base zone of said first conductivity type, at least one surface-adjoining emitter zone of the second conductivity type and a collector zone of the second conductivity type which is formed at least partly by the associated buried layer of the second conductivity type;
   C. cross-links between the base zone of the first transistor and the collector zone of the second transistor and between the base zone of the second transistor and the collector zone of the first transistor;
   D. first and second load elements between a supply line and the collector zones of the first and the second transistors, respectively, which load elements each comprise a resistor and a diode connected in parallel, the resistors of the first and the second load elements, respectively, being formed by a resistance region of the first conductivity type extending between the base zone of the second transistor and a supply connection in the second island and by a resistance region of the first conductivity type extending between the base zone of the first transistor and a supply connection in the first island, the diodes of the first and second load elements being formed by the p-n junctions between the buried layer below the first island and the resistance region in the first island, and between the buried layer below the second island and the resistance region in the second island, respectively;
   E. third and fourth transistors in the first and second islands, respectively, at the area of the said supply connections, which transistors comprise a base zone of the first conductivity type and an emitter zone and a collector zone of the second conductivity type, the emitter-base junctions of said transistors being formed by said p-n junctions between the buried layers of the second conductivity type and the resistance region of the first conductivity type, the collector zones of said transistors being formed by surface zones of the second conductivity type which are provided in the resistance regions and which form p-n junctions with the resistance regions, said collector-base junctions being short-circuited by the supply connections.

2. A static memory cell as claimed in claim 1, characterized in that the islands are insulated from the remainder of the semiconductor body along their lateral circumference by a pattern of sunken silicon oxide which extends from the surface of the semiconductor body down to the buried layers.

3. A static memory cell as claimed in claim 1 or 2, characterized in that the resistivity of at least a part of the resistance regions is higher than that of the base zones of the first and second transistors.

4. A static memory constructed from a number of memory cells as claimed in claim 1.

* * * * *